(12) United States Patent
Yoshikawa

(10) Patent No.: US 6,977,464 B2
(45) Date of Patent: Dec. 20, 2005

(54) ORGANIC EL DEVICE AND MANUFACTURING METHOD FOR THE SAME

(75) Inventor: Kota Yoshikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/060,807

(22) Filed: Feb. 18, 2005

(65) Prior Publication Data

US 2005/0134172 A1 Jun. 23, 2005

Related U.S. Application Data

(63) Continuation of application No. PCT/JP2003/010346, filed on Aug. 14, 2003.

(30) Foreign Application Priority Data

Aug. 21, 2002 (JP) ............................. 2002-240087

(51) Int. Cl.[7] .............................................. H01J 1/62
(52) U.S. Cl. ...................... 313/504; 313/506; 445/23
(58) Field of Search ................................. 313/498, 503, 313/504, 506, 512; 445/23, 24

(56) References Cited

U.S. PATENT DOCUMENTS

| 2001/0026125 A1 | 10/2001 | Yamazaki et al. | |
|---|---|---|---|
| 2002/0033664 A1 | 3/2002 | Kobayashi | |
| 2004/0169465 A1 * | 9/2004 | Do et al. | 313/506 |
| 2004/0207321 A1 * | 10/2004 | Nishikawa et al. | 313/506 |

FOREIGN PATENT DOCUMENTS

| EP | 0989778 | 3/2000 |
|---|---|---|
| JP | 10-106747 | 4/1998 |
| JP | 11-74082 | 3/1999 |
| JP | 2000-202357 | 7/2000 |
| JP | 2001-126867 | 5/2001 |
| JP | 2001-291583 | 10/2001 |
| JP | 2001-345179 | 12/2001 |
| WO | WO99/48339 | 9/1999 |
| WO | WO 01/63975 A1 | 8/2001 |

* cited by examiner

Primary Examiner—Vip Patel
(74) Attorney, Agent, or Firm—Westerman, Hattori, Daniels & Adrian, LLP

(57) ABSTRACT

The present invention provides an organic EL device including a pair of electrodes consisting of a positive electrode and a negative electrode; a plurality of banks which is disposed between the pair of electrodes and insulates the positive electrode and the negative electrode; and an organic EL light-emitting material in a plurality of gaps formed by bank partitions, wherein if the distance between the bank partitions in the gap at one electrode side is d, the distance between the bank partitions except at the one electrode side is d' and the distance between the bank partitions at the other electrode side to the one electrode side is d", then at least one of the gaps satisfies d>d", and the distance between the bank partitions in the gap progressively satisfies d−d'≧0 from the one electrode side to the other electrode side. The present invention also provides an efficient method of manufacturing the organic EL device.

27 Claims, 3 Drawing Sheets

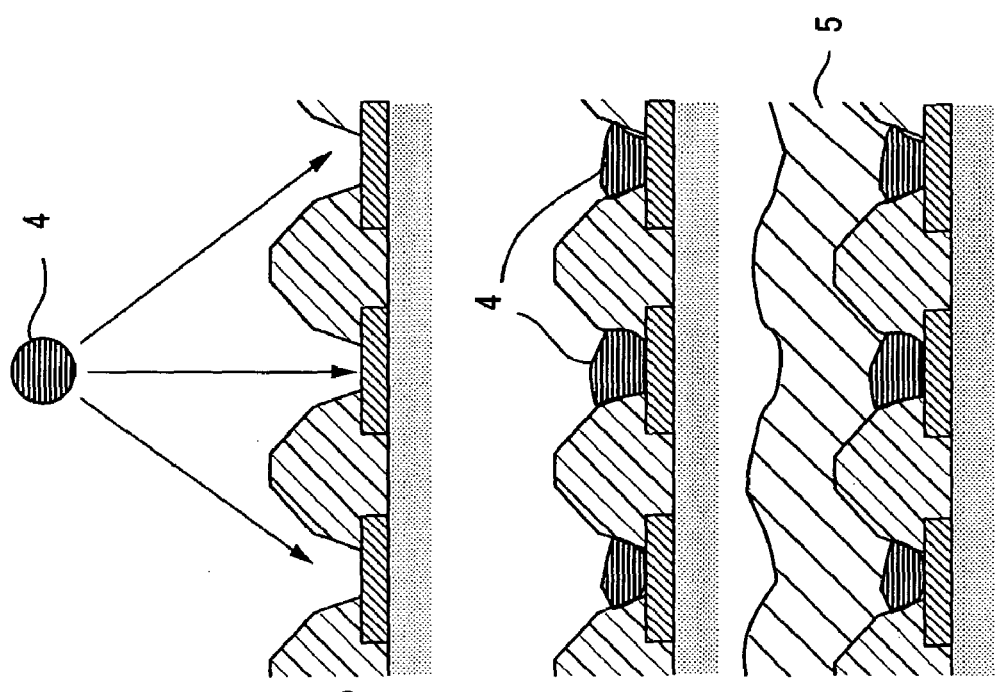
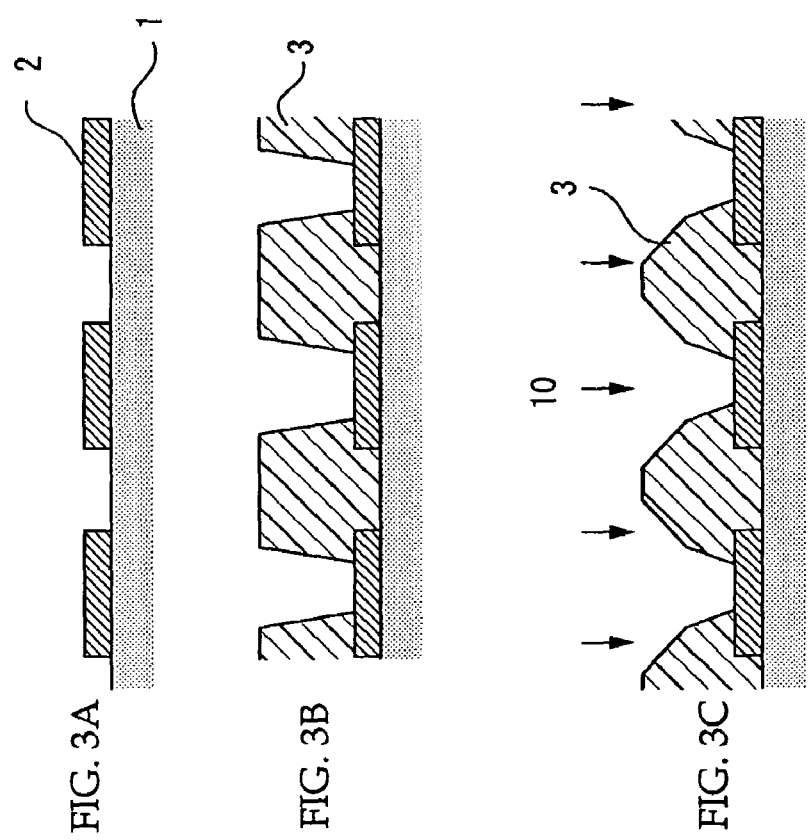

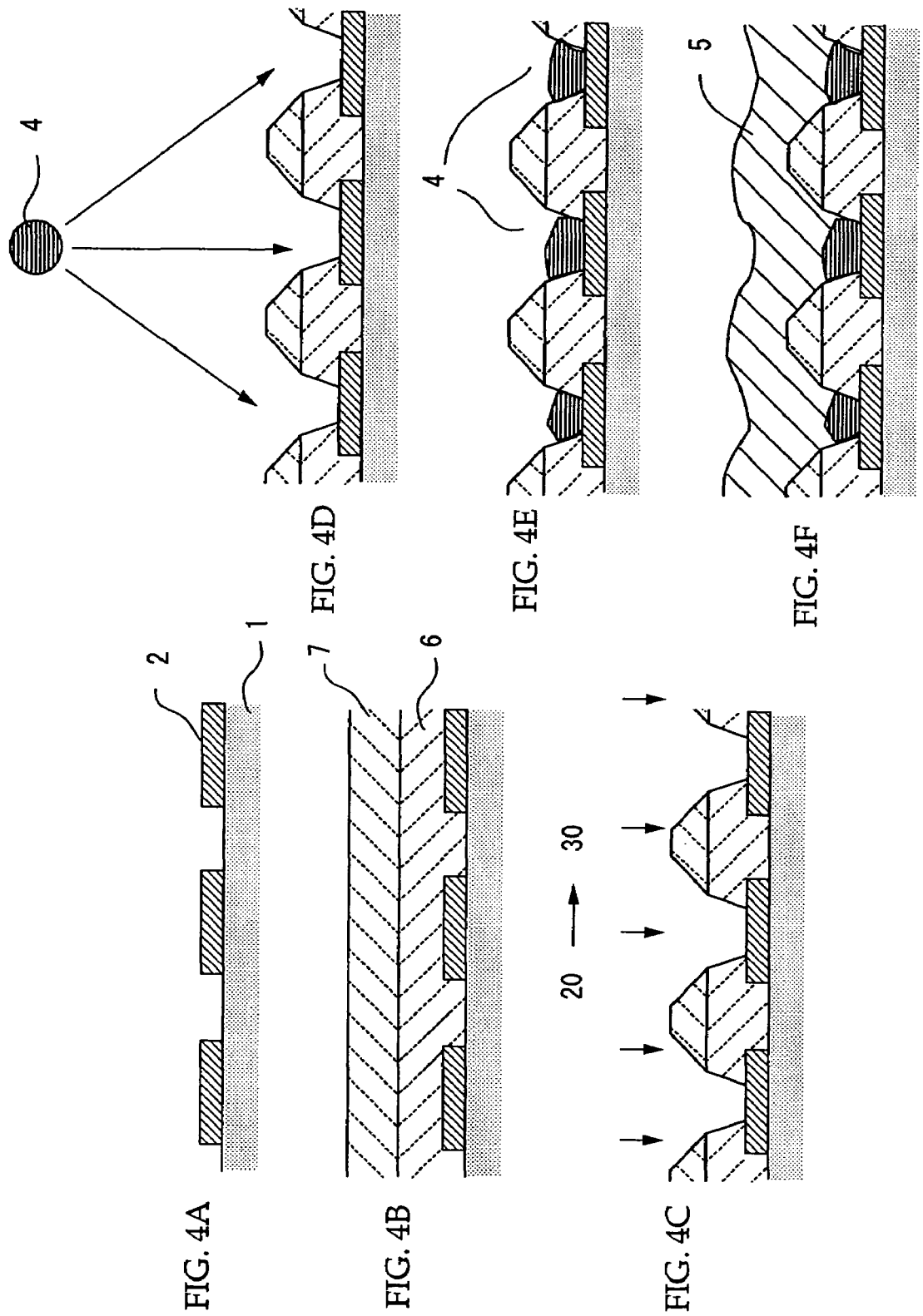

ORGANIC EL DEVICE AND MANUFACTURING METHOD FOR THE SAME

CROSS-REFERENCE TO RELATED APPLICATIONS

This is a continuation of Application PCT/JP2003/010346, filed on Aug. 14, 2003.

BACKGROUND OF THE INVENTION

1. Field of the Invention

The present invention relates to an organic EL device using a polymer material as an organic EL light-emitting material, and to an efficient method of manufacturing the same.

2. Description of the Related Art

An organic EL device is a solid spontaneous light-emitting device which can be driven by a low voltage as compared with an inorganic EL element, and as compared with a conventional inorganic LED, it can be produced without a complicated growth process. Considering applications to portable displays, especially in comparison with a liquid crystal display (LCD), products with displays using an organic EL device does not require a backlight since light is emitted spontaneously, is lightweight and can be produced at low cost. The products with displays using an organic EL device have advantages such as a fast response and invulnerable to shocks due to the use of all solid state components. Organic EL devices are also expected to find application in flat panel displays.

The EL light-emitting material used for an organic EL device may be a monomer material or a polymer material. In general, a monomer material film is formed by vacuum deposition and a polymer material film is formed by a coating method. Forming the polymer material film does not require an expensive apparatus and is practical.

However, in the case of a full color display, if a polymer material is used as the EL light-emitting material, there is a problem in that it is difficult to form pixels by finely coating different EL light-emitting materials having light emission properties in the three primary colors, blue (B), green (G) and red (R). In the related art, different polymer materials were generally coated and distinguished by vacuum vapor deposition using a metal mask, but in this case, there is a limit to the machining dimensions of the metal mask. Further, it is difficult to increase the alignment precision of the mask. As a result, the resolution of the coated material could not be increased, and the device was also costly.

As another means of finely coating each of the polymers with different light emissions in the three primary colors, blue (B), green (G) and red (R), to form pixels, the inkjet method has also been considered. In this case, the polymer material can be used efficiently (there is little waste), and a higher definition pixel pattern can be formed than with a metal mask.

However, if the polymer was coated by the inkjet method, the polymer material used as the EL light-emitting material had to be injected in the form of an inkjet ink from a nozzle head into gaps formed by partitions of an insulating bank between a positive electrode and a negative electrode. As opening of the gap was small, the inkjet ink could not be supplied to a predetermined gap with reliability. This led to the problems such as color blur, or short-circuits between the positive electrode and negative electrode.

Accordingly, an object of the present invention is to provide an organic EL device which has a plurality of highly fine pixels, does not have problems such as color blur or short-circuiting between positive and negative electrodes, allows enlargement of the substrate easily, does not require a large vacuum device etc., does not require mask alignment, can utilize a material highly efficiently, is easily mass-produced, is high quality and can be suitably used as display or the like. Another object of the present invention is to provide an efficient method of manufacturing the organic EL device.

SUMMARY OF THE INVENTION

The organic EL device of the present invention includes a pair of electrodes consisting of a positive electrode and a negative electrode; a plurality of banks which is disposed between the pair of electrodes and insulates the positive electrode and the negative electrode; and an organic EL light-emitting material in a plurality of gaps formed by bank partitions, wherein if the distance between the bank partitions in the gap at one electrode side is d, the distance between the bank partitions except at the one electrode side is d" and the distance between the bank partitions at the other electrode side to the one electrode side is d", then at least one of the gaps satisfies d>d", and the distance between the bank partitions in the gap progressively satisfies $d-d' \geqq 0$ from the one electrode side to the other electrode side. In this organic EL device, since the opening diameter of the gap progressively increases from the other electrode side to the one electrode side, inkjet ink which is the EL light-emitting material, can be easily and surely injected into the gap from a nozzle head to thereby be supplied to the gaps. As a result, in this organic EL device, a plurality of pixels is highly fine, there are no problems such as color blur or short-circuiting between positive and negative electrodes, the device can be easily mass-produced and it can be conveniently used as a display or the like.

The method of manufacturing the organic EL device of the present invention is one of the following two manufacturing methods, i.e., (1) the bank is formed by patterning from a material selected from among a photoresist and a heat-resistant polymer, and then plasma treatment is performed, or (2) the bank is formed by patterning from among inorganic materials, and then etching is performed. In the method of manufacturing the organic EL device according to the present invention, in the above (1), the banks are first formed by patterning from a material selected from among a photoresist and a heat-resistant polymer, and the patterned banks are then plasma-treated. The part around the opening of the gaps formed by the partitions of this pattern is trimmed, so the opening diameter becomes larger than at the base of the gap. In the above (2), banks are first formed by patterning from the inorganic material, then this patterned banks are then etched. The part around the opening of the gaps formed by the partitions of this pattern is trimmed, so the opening diameter becomes larger than at the base of the gap. In both the above (1) and (2), the opening diameter in the vicinity of the openings of the gaps is large, therefore the EL light-emitting material is easily and surely supplied to these gaps. As a result, the organic EL device of the present invention, which has a plurality of fine pixels, does not have problems such as color blur or short-circuiting between positive and negative electrodes, and is suitable for use as a display or the like, can be efficiently manufactured.

Further objects, features and advantages of the present invention will become apparent from the following description of the preferred examples with reference to the attached drawings.

BRIEF DESCRIPTION OF THE DRAWINGS

FIGS. 3A, 3B, 3C, 3D, 3E, and 3F are schematic diagrams describing an example of the method of manufacturing the organic EL device of the present invention.

FIGS. 4A, 4B, 4C, 4D, 4E, and 4F are schematic diagrams describing another example of the method for manufacturing the organic EL device of the present invention.

DESCRIPTION OF THE PREFERRED EMBODIMENTS

Organic EL Device

Figure 1:
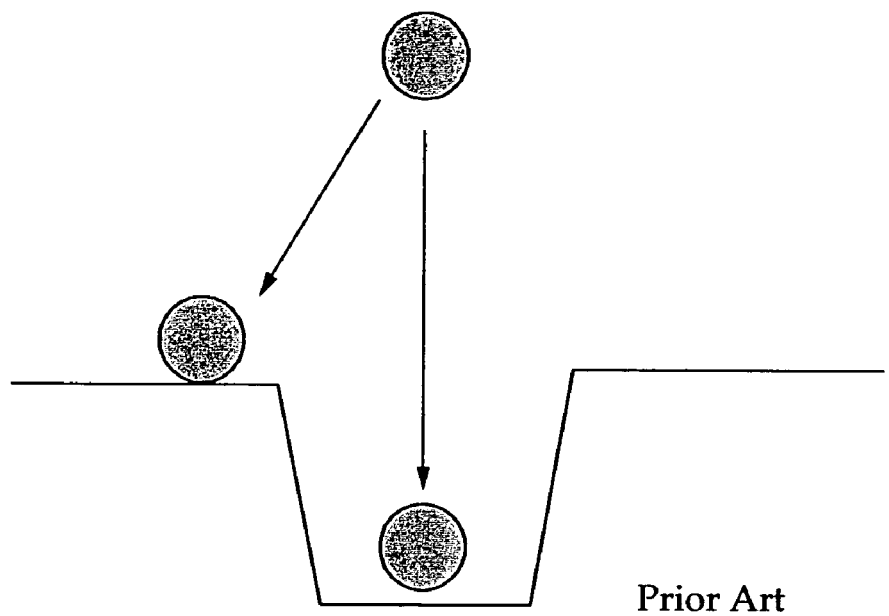
FIG. 1 is a schematic diagram describing an example of a bank in an organic EL device of the related art.

The organic EL device of the present invention comprises a plurality of banks disposed between a positive electrode and a negative electrode which insulate this positive electrode and negative electrode, and an organic EL light-emitting material in a plurality of gaps formed by bank partitions. It further comprises other layers or members, such as a hole injection layer, a hole transport layer, an electron transport layer, an electron injection layer and a sealing agent, if required.

In the organic EL device of the present invention, at least one of the plurality of gaps must satisfy the following conditions, but preferably 90% or more of all the gaps openings satisfy the following conditions, and more preferably, all the gaps satisfy the following conditions.

These conditions are that if the distance between the bank partitions in the gap at one electrode side is d, the distance between the bank partitions except at this one electrode side is d' and the distance between the bank partitions at the other electrode side to this one electrode side is d", then d>d", and the distance between the bank partitions in these gaps progressively satisfies d−d'≧0 from the one electrode side to the other electrode side.

If these conditions are satisfied, the opening diameter of the gap is larger at the one electrode side than at the other electrode side. Therefore, inkjet ink which is an organic EL light-emitting material can be easily and surely enclosed in this gap and the organic EL device can be efficiently manufactured. In addition, the obtained organic EL device is a high quality with fine pixels.

In the organic EL device of the present invention, at least one of the plurality of gaps must satisfy the following conditions, but preferably 90% or more of the gaps satisfy the following condition, and more preferably, all the gaps satisfy the following condition.

This condition is that gap(s) is formed by bank partitions having n steps, and if the distances between the bank partitions at the bases of the n steps are d1, d2, . . . , dn−1, dn from the one electrode side to the other electrode side, d1>d2> . . . >dn−1>dn.

If this condition is satisfied, the bank has a multi-step structure and is trimmed wider from the other electrode side toward the one electrode side. In the gap formed by the bank partitions, the opening diameter is larger at the one electrode side than at the other electrode side. Therefore, the inkjet ink which is the organic EL light-emitting material can be easily and surely enclosed in this gap, and the organic EL device can be efficiently manufactured. In addition, the obtained organic EL device is a high quality with fine pixels.

When the bank has two or more steps, and the gaps are formed by the bank partitions, at least one of the plurality of gaps must satisfy the following condition, but preferably 90% or more of all the gaps satisfy the following condition, and more preferably, all the gaps satisfy the following condition.

This condition is that the bank partitions which are situated closest to the one electrode side and form steps having the greatest distance between bank partitions, have a tapered shape.

If this condition is satisfied, the inkjet ink which is the organic EL light-emitting material can be easily and surely enclosed in the gaps formed by the bank partitions since opening part of the bank has a tapered shape with a large opening diameter and the organic EL device can be efficiently manufactured. In addition, the obtained organic EL device is a high quality with fine pixels.

When the bank has two or more steps, and gaps are formed by the partitions of this bank, at least one of the plurality of gaps must satisfy the following condition, but preferably 90% or more of all the gaps satisfy the following condition, and more preferably, all the gaps satisfy the following condition.

This condition is that all the steps constituting the bank partitions has tapered shape.

If this condition is satisfied, the inkjet ink which is the organic EL light-emitting material is guided along the tapered partition with a large opening diameter situated at the bank opening, and then along the tapered partition with a smaller opening diameter to thereby be enclosed in the gaps easily and surely, and the organic EL device can be efficiently manufactured. In addition, the obtained organic EL device is a high quality with fine pixels.

According to the present invention, among the banks having two or more steps, from the viewpoint of manufacturing efficiency, it is preferred that there are two steps, and from the viewpoint of enclosing the organic EL material efficiently and surely in the gaps by the inkjet method, it is more preferred that the partitions in the bank having two steps, have a two-step tapered shape.

If the bank has two or more steps, it is preferred that in this bank, the taper angle of the step base at the one electrode side is smaller than the taper angle of the step base at the other electrode side. In this case, the organic EL light-emitting material can be enclosed efficiently and surely by the inkjet method in the gap formed by these bank partitions.

Additionally, in the present invention, from the viewpoint of manufacturing efficiency, the one electrode side is preferably the positive electrode side, and the other electrode side is preferably the negative electrode side.

The bank is not particularly limited provided that it is formed of an insulating material which can be patterned, and may be suitably selected according to the purpose. Suitable examples are a photoresist, heat-resistant polymer and inorganic material.

The photoresist is not particularly limited and may be suitably selected from those known in the art according to the purpose. Examples thereof include a positive type photoresist, negative type photoresist and the like.

The heat-resistant polymer is not particularly limited and may be suitably selected from those known in the art according to the purpose. Suitable examples thereof include a polyimide and the like.

The inorganic material is not particularly limited and may be suitably selected from those known in the art according to the purpose. Suitable examples thereof include silicon nitride and silicon oxide and the like.

These may be used alone, or two or more may be used in combination. Further, the bank may be a laminated structure. Suitable example is a laminate of silicon nitride and silicon oxide.

The organic EL light-emitting material is not particularly limited and may be suitably selected according to the purpose, but it is preferred that it can be dissolved in solution and injected towards the gap from a nozzle head by the inkjet method, and more preferred that it is selected from among polymer materials.

The polymer material is not particularly limited and may be suitably selected from known materials currently used in polymer organic EL devices. Examples thereof include polyparaphenylene vinylene (PPV), PV, and the like.

In the present invention, a light-emitting layer is formed from the organic EL light-emitting material enclosed in the gaps, and pixels are formed by the gaps having the light-emitting layer. Herein, a full color display can be designed by suitably selecting the organic EL light-emitting materials to be enclosed in the gaps from a red light-emitting material, a green light-emitting material and a blue light-emitting material and combining them.

The light-emitting layer may, for example, be formed by an inkjet method where inkjet ink is injected and supplied to the gaps using a nozzle head, and then drying it as appropriate.

The thickness of the light-emitting layer is preferably 50 to 200 nm, but more preferably 70 to 150 nm.

When the thickness of the light-emitting layer is within this preferable numerical value range, the light-emitting efficiency, emission luminance and color purity of this organic EL device are satisfactory.

The organic EL device of the present invention comprises the light-emitting layer in the gaps formed by the bank partitions between the positive electrode and negative electrode, and may further comprise other layers and/or members suitably selected according to the purpose.

Positive Electrode

The positive electrode is not particularly limited and may be suitably selected according to the purpose. Specifically, when the organic thin film layer comprises only the light-emitting layer, it is preferred to supply positive holes (carrier) to the light-emitting layer. When the organic thin film layer comprises a positive hole transport layer in addition to the light-emitting layer, it is preferred to supply positive holes (carrier) to the positive hole transport layer. When the organic thin film layer further comprises a positive hole injection layer, it is preferred to supply positive holes (carrier) to the positive hole injection layer.

The material of the positive electrode is not particularly limited and may be suitably selected according to the purpose. The material can be suitably selected according to the purpose. Examples of the material include metals, alloys, metal oxide, electrically conducting compounds, mixtures thereof, and the like. Of these, materials having a work function of 4 eV or more are preferred.

Specific examples of the material of the positive electrode include electrically conducting metal oxides such as tin oxide, zinc oxide, indium oxide, indium tin oxide (ITO) or the like; metals such as gold, silver, chromium, nickel, or the like; mixtures or laminates of these metals and electrically conducting metal oxides; inorganic electrically conducting substances such as copper iodide and copper sulfide; organic electrically conducting materials such as polyaniline; polythiophene and polypyrrole, and laminates of these with ITO; and the like. These may be used alone, or two or more may be used in combination. Of these, the electrically conducting metal oxides are preferred, and ITO is particularly preferred from the viewpoints of productivity, high conductivity and transparency.

The thickness of the positive electrode is not particularly limited and may be suitably selected according to the material or the like. The thickness is preferably 30 to 500 nm, and more preferably 50 to 200 nm.

The positive electrode is typically formed on a substrate such as glass, soda lime glass, non-alkali glass, a transparent resin, or the like.

When using the glass as the substrate, non-alkali glass or soda lime glass with a barrier layer of silica or the like, is preferred from the viewpoint of lessening elution ions from the glass.

The substrate thickness is not particularly limited as long as it is sufficient to maintain mechanical strength. When using glass as the substrate, however, it is typically 0.2 mm or more, and preferably 0.7 mm or more.

The positive electrode may be conveniently formed by methods such as vapor deposition method, wet film forming method, electron beam method, sputtering method, reactive sputtering method, Molecular beam epitaxy (MBE) method, cluster ion beam method, ion plating method, plasma polymerization method (high frequency excitation ion plating method), molecule laminating method, Langmuir-brodgett (LB) method, printing method, transfer method and the method of applying a dispersion of ITO by a chemical reaction method (sol gel process, or the like).

By washing the positive electrode and performing other treatment, the driving voltage of the organic EL device can be reduced, and the light-emitting efficiency can also be increased. When the material of the positive electrode is ITO, examples of the other treatment include UV ozonization and plasma processing, and the like.

Negative Electrode

The negative electrode is not particularly limited and may be suitably selected according to the purpose. It is preferred that the negative electrode supplies electrons to the organic thin film layer, specifically, to a light-emitting layer when the organic thin film layer comprises only the light-emitting layer or when the organic thin film layer comprises an electron transport layer in addition to the light-emitting layer, it is preferred to supply electrons to this electron transport layer. When an electron injection layer is interposed between the organic thin film layer and the negative electrode, it is preferred to supply electrons to the electron injection layer.

The material of the negative electrode is not particularly limited. The material can be suitably selected according to adhesion properties with the layers or molecules adjoining this negative electrode, such as the electron transport layer and light-emitting layer, and according to ionization potential, and stability. Examples of the material include metals, alloys, metal oxides, electrically conducting compounds, mixtures thereof, and the like.

Specific examples of the material of the negative electrode include alkali metals (for example, Li, Na, K, Cs), alkaline earth metals (e.g., Mg, Ca), gold, silver, lead, aluminum, sodium-potassium alloys or mixtures thereof, lithium-aluminium alloys or mixtures thereof, magnesium-silver alloys or mixtures thereof, rare earth metals such as indium and ytterbium, and alloys thereof.

These may be used alone, or two or more may be used in combination. Of these, materials having a work function of 4 eV or less are preferred. Aluminum, lithium-aluminium alloys or mixtures thereof, or magnesium-silver alloys or mixtures thereof, are more preferred.

The thickness of the negative electrode is not particularly limited and may be suitably selected depending on the material of the negative electrode. The thickness is preferably 1 nm to 10,000 nm, and more preferably 20 nm to 200 nm.

The negative electrode can be conveniently formed by methods such as vapor deposition method, wet film forming method, electron beam method, sputtering method, reactive sputtering method, Molecular beam epitaxy (MBE) method, cluster ion beam method, ion plating method, plasma polymerization method (high frequency excitation ion plating method), molecule laminating method, Langmuir-brodgett (LB) method, printing method and transfer method.

When two or more of these are used together as the material of the negative electrode, two or more materials may be vapor-deposited simultaneously to form an alloy electrode, or a pre-prepared alloy may be made to vapor-deposit so as to form an alloy electrode.

The resistances of the positive electrode and negative electrode are preferably low, and it is preferred that they are not more than several hundred ohms per square.

Hole Injection Layer

The hole injection layer is not particularly limited and may be suitably selected according to the purpose. It is preferred that it has the function of, for example, injecting positive holes from the positive electrode when an electric field is applied.

Examples thereof are PEDOT: PSS (poly-3,4-ethylenedioxythiophene doped with poly(styrenesulfonate), a starburst amine (4,4', 4"-tris[3-methylphenyl(phenyl) amino] triphenylamine:m-MTDATA) represented by the following formula, copper phthalocyanine or polyaniline.

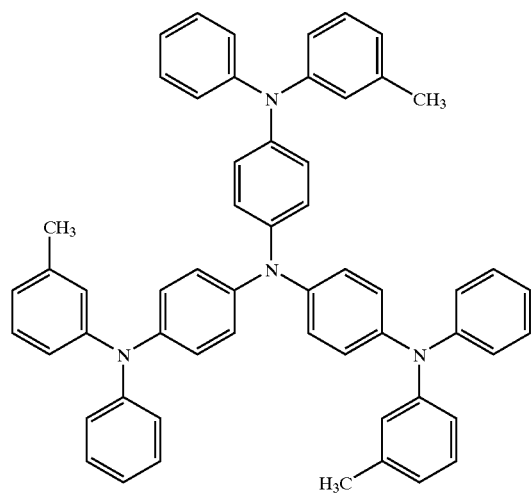

The thickness of the hole injection layer is not particularly limited and may be suitably selected according to the purpose, but for example 50 to 150 nm is preferred, and 70 to 100 nm is more preferred.

The hole injection layer can be conveniently formed by methods such as vapor deposition method, wet film forming method, electron beam method, sputtering method, reactive sputtering method, Molecular beam epitaxy (MBE) method, cluster ion beam method, ion plating method, plasma polymerization method (high frequency excitation ion plating method), molecule laminating method, Langmuir-brodgett (LB) method, printing method and transfer method.

Other Layers or Members

The organic EL device of the present invention may comprise other layers or members suitably selected according to the purpose. Suitable examples of such other layers are a protective layer, or a sealing agent.

The protective layer is not particularly limited and may be suitably selected according to the purpose. However, it is preferably a layer which can deter molecules or substances which promote deterioration of the organic EL device, such as moisture and oxygen, from entering the organic EL device.

Examples of the material of the protective layer include metals such as In, Sn, Pb, Au, Cu, Ag, Al, Ti, and Ni, metal oxides such as MgO, SiO and $SiO_2$, $Al_2O_3$, GeO, NiO, CaO, BaO, $Fe_2O_3$, $Y_2O_3$ and $TiO_2$, nitrides such as SiN and $SiN_xO_y$, metal fluorides such as $MgF_2$, LiF, $AlF_3$, $CaF_2$, polyethylene, polypropylene, polymethyl methacrylate, polyimide, polyurea, polytetrafluoroethylene, polychlorotrifluoroethylene, polydichlorodifluoroethylene, a copolymer of chlorotrifluoroethylene and dichlorodifluoroethylene, a copolymer obtained by copolymerizing a monomer mixture comprising tetrafluoroethylene and at least one comonomer, a fluorine-containing copolymer having a ring structure in a main chain of the copolymer, a water-absorbing substance having a water absorption rate of 1% or more, and a damp-proof substance having a water absorption rate of 0.1% or less.

The protective layer can be conveniently formed by methods such as vapor deposition method, wet film forming method, sputtering method, reactive sputtering method, Molecular beam epitaxy (MBE) method, cluster ion beam method, ion plating method, plasma polymerization method (high frequency excitation ion plating method), printing method and transfer method.

The structure of the organic EL device of the present invention is not particularly limited and may be suitably selected according to the purpose. Examples of the structures include the following (1) to (13):

(1) Positive electrode/hole injection layer/hole transport layer/light-emitting layer/electron transport layer/electron injection layer/negative electrode, (2) Positive electrode/hole injection layer/hole transport layer/light-emitting layer/electron transport layer/negative electrode, (3) Positive electrode/hole transport layer/light-emitting layer/electron transport layer/electron injection layer/negative electrode, (4) Positive electrode/hole transport layer/light-emitting layer/electron transport layer/negative electrode, (5) Positive electrode/hole injection layer/hole transport layer/light-emitting and electron transport layer/electron injection layer/negative electrode, (6) Positive electrode/hole injection layer/hole transport layer/light-emitting and electron transport layer/negative electrode, (7) Positive electrode/hole transport layer/light-emitting and electron transport layer/electron injection layer/negative electrode, (8) Positive electrode/hole transport layer/light-emitting and electron transport layer/negative electrode,
(9) Positive electrode/hole injection layer/hole transport and light-emitting layer/electron transport layer/electron injection layer/negative electrode
(10) Positive electrode/hole injection layer/hole transport and light-emitting layer/electron transport layer/negative electrode,
(11) Positive electrode/hole transport and light-emitting layer/electron transport layer/electron injection layer/ negative electrode,
(12) Positive electrode/hole transport and light-emitting layer/electron transport layer/negative electrode,
(13) Positive electrode/hole transport, light-emitting and electron transport layer/negative electrode, and the like.

When the organic EL device comprises a hole blocking layer, layer configurations in which the hole blocking layer is interposed between the light-emitting layer and electron transport layer in the configuration (1) to (13) presented above may also be suitable.

The organic EL device may be a monochrome light emission, a multicolor light emission or a full color light type.

The organic EL device may be made a full color type as disclosed in *Monthly Display* (published by Techno Times Co., Ltd. of Japan), September 2000, pages 33–37, i.e., (a) the three color light emitting method where three types of organic EL devices which, respectively, emit light corresponding to the three primary colors (blue (B), green (G), red (R)) are disposed on a substrate; (b) the white method where white light from an organic EL device for white light emission is divided into the three primary colors via color filters; (c) and the color conversion method where blue light emitted by an organic EL device for blue light emission is converted into red (R) and green (G) via a fluorescent pigment layer. In the present invention, the three color light emitting method is particularly suitable.

The drive mode of the organic EL device is not particularly limited and may be suitably selected according to the purpose. Suitable examples of the drive mode include the passive matrix panel and active matrix panel disclosed in Nikkei Electronics, No. 765, Mar. 13, 2000, pages 55–62.

The organic EL display of the present invention may be conveniently used in various kinds of fields such as computers, vehicle-mounted display devices, field-ready display devices, home apparatuses, industrial apparatuses, household electric appliances, traffic display devices, clock display devices, calendar display units, luminescent screens and audio equipment.

Method of Manufacturing Organic EL Device

The method of manufacturing the organic EL device of the present invention includes one of the following two manufacturing methods, i.e., (1) the bank is patterned from a material selected from among a photoresist and a heat-resistant polymer, followed by plasma treatment, or (2) the bank is patterned from among inorganic materials, followed by etching.

In the method of manufacturing the organic EL device of the present invention, treatments or steps other than those of the above (1) or (2) are not particularly limited, and may be suitably selected from known methods according to the purpose. Examples thereof are a positive electrode patterning step, a step of forming a hole transport layer on the positive electrode, a step of forming a light-emitting layer on the hole transport layer, a step of forming an electron transport layer on the light-emitting layer, and a step of forming a negative electrode on the electron transport layer.

The above (1) includes a bank forming step and a plasma treatment step, whereas the above (2) includes a bank forming step and an etching step.

The bank forming step is, for example, a step wherein a material selected from among the above-mentioned photoresist and heat-resistant polymer is coated on the positive electrode to form a coating film, or the above-mentioned inorganic material is vapor-deposited to form a vapor-deposition film, and the film is then patterned to form the bank by photolithography.

The bank forming conditions are not particularly limited and may be suitably selected according to the purpose.

The coating method is not particularly limited and may be suitably selected from known methods, such as the spin coating method.

The method of vapor deposition is not particularly limited and may be suitably selected from known methods, such as CVD METHOD.

The plasma treatment step is not particularly limited regarding its conditions etc. and may be suitably selected according to the purpose, but it is preferably performed using a plasma gas selected from among an oxygen plasma and a fluorine plasma. In this case, when the bank is formed from a resin material such as polyimide, the bank can be efficiently trimmed.

The etching process is not particularly limited regarding its conditions, and may be suitably selected according to the purpose, but it is preferably performed using two or more types of etching gas. In this case, when the bank is formed with the aforesaid inorganic material, the bank can be efficiently trimmed.

Suitable examples of the etching gas are $CF_4/O_2$ gas and $CF_4$ gas.

In the etching process, when performing an etching using two types of etching gas, it is preferred to perform the etching as follows. When changing over from $CF_4/O_2$ gas to $CF_4$ gas, it is preferable to perform the etching by monitoring plasma $N_2$. When changing over from $CF_4$ gas to $CF_4/O_2$ gas, it is preferred to perform the etching by monitoring plasma $F_2$. In this case, when the intensity of the plasma $F_2$ or plasma $N_2$ being monitored reaches 15 to 25%, it is preferable to change the etching gas.

When patterning of the bank is performed with two types of inorganic materials, it is preferred to make the surface etching rate larger than the lower layer etching rate.

In the step of forming the light-emitting layer, with the inkjet method using a nozzle head, a solution (above-mentioned inkjet ink) containing the organic EL light-emitting material is injected and supplied from the nozzle head to the gaps formed by the bank partitions which is formed by the plasma step or etching step. Subsequently, by drying and/or performing other suitable treatments, a light-emitting layer of this organic EL light-emitting material is formed in gaps.

The organic EL device of the present invention can be efficiently manufactured by the method of manufacturing the organic EL device of the present invention described hereinabove.

Figure 2:
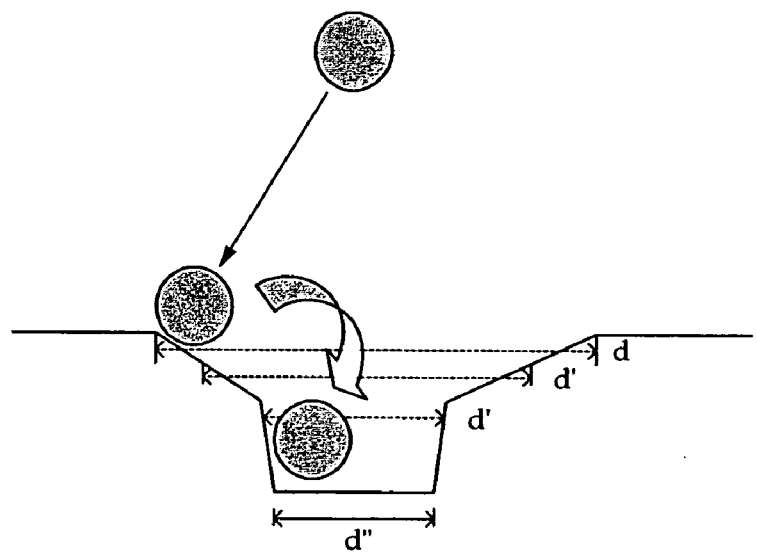
FIG. 2 is a schematic diagram describing an example of a bank in the organic EL device of the present invention.

In the manufactured organic EL device of the present invention, as shown in FIGS. 1 and 2, compared with the banks in the related art, the part around the opening part (exposed end) in the bank partitions is trimmed, and the opening diameter of the gap formed by the bank partitions is larger than that at the base of the gap. Therefore, compared with the gaps formed by the bank partitions in the related art, the organic EL light-emitting material is supplied to the gaps formed by the bank partitions of the present invention more easily and surely.

At this time, if the bank has a single step structure with one taper as in the related art example shown in FIG. 1, the inkjet ink can be reliably contained in the gap by making the taper mild, but as the opening of the gap becomes very wide, the pattern cannot be made very fine. On the other hand, a fine opening can be formed due to the fine gap by making the taper structure sharp, but it is difficult for the inkjet ink sprayed (discharged) from the nozzle head to be contained in the predetermined gap. However, if the bank has, for example, a two-step structure as shown in FIG. 2 in the present invention, each step has tapered structure, so the drops of inkjet ink (containing the organic EL light-emitting material) injected (discharged) towards the gap formed by the bank partitions from the nozzle head can be made to roll downward along the upper taper structure, and then the drops reach at the edge of the lower taper to fall exactly into the gap. As a result, this organic EL device has a plurality of fine pixels, does not have problems such as color blur or short-circuiting between positive and negative electrodes, and can suitably be used as a display etc.

The present invention will be illustrated in further detail with reference to several examples below, which are not intended to limit the scope of the present invention.

EXAMPLE 1

As shown in FIG. 3A, ITO 2 was formed as a positive electrode (lower electrode) on a glass substrate 1 by the sputtering method to a thickness of 2,000 Å (200 nm). Next, the ITO 2 was fashioned into a stripe-shape by photolithography and wet etching.

Polyimide 3 was used to form a film on this ITO to a thickness of 5,000 Å (500 nm) by spin coating. Then, as shown in FIG. 3B, a bank pattern was formed by photolithography.

Next, as shown in FIG. 3C, a two-step taper structure was formed by treating this bank pattern by $O_2$ plasma 10 for 3 minutes.

Next, as shown in FIG. 3D, inkjet ink (containing an organic EL light-emitting material) 4 was injected (discharged) by the inkjet method from a nozzle head towards the gaps formed between these bank patterns, i.e., the gaps formed by the partitions of these banks, and as shown in FIG. 3E, the inkjet ink 4 was made to be contained in the gaps.

Then, as shown in FIG. 3F, AlLi 5 was vapor-deposited in a stripe-shape as a negative electrode (upper electrode) to a thickness of 3,000 Å (300 nm) using a metal mask so as to cover the surface of the inkjet ink and the banks.

When a current was applied to the organic EL device manufactured as described above so that the AlLi side was the negative electrode and the ITO side was the positive electrode, EL light emission was observed from the ITO side.

EXAMPLE 2

As shown in FIG. 4A, ITO 2 was formed as a positive electrode (lower electrode) on a glass substrate 1 by the sputtering method to a thickness of 2,000 Å (200 nm). Next, the ITO 2 was fashioned into a stripe-shape by photolithography and wet etching.

Next, as shown in FIG. 4B, a lamination film comprising $SiO_2$ (thickness: 2,000 Å [200 nm]) 6 and SiN (thickness: 3,000 Å [300 nm]) 7 laminated in this order was formed by CVD METHOD on the ITO. Next, a bank pattern was formed by photolithography, and as shown in FIG. 4C, the region around the openings of the banks was etched by reactive ion etching. Specifically, the SiN was etched using $CF_4/O_2$ gas 20, and the $SiO_2$ was etched using $CF_4$ gas 30. During etching, the light emission of the $N_2$ was monitored, and when its intensity reached 20%, the etching gas was changed. As a result, as shown in FIG. 4C, a bank with a two-step tapered structure was formed.

Next, as shown in FIG. 4D, inkjet ink (containing an organic EL light-emitting material) 4 was injected (discharged) by the inkjet method from a nozzle head towards the gaps formed between these bank patterns, i.e., the gaps formed by the partitions of these banks and as shown in FIG. 4E, the inkjet ink 4 was made to be contained in the gaps.

Then, as shown in FIG. 4F, AlLi 5 was vapor-deposited in a stripe-shape as a negative electrode (upper electrode) to a thickness of 3,000 Å (300 nm) using a metal mask so as to cover the surface of the inkjet ink and the banks.

When a current was applied to the organic EL device manufactured as described above so that the AlLi side was the negative electrode and the ITO side was the positive electrode, EL light emission was observed from the ITO side.

The present invention provides an organic EL device which has a plurality of highly fine pixels, does not have problems such as color blur or short-circuiting between positive and negative electrodes, allows enlargement of the substrate easily, does not require a large vacuum device etc., does not require mask alignment, can utilize a material highly efficiently, is easily mass-produced, is high quality and can be suitably used as display or the like. The present invention also provides an efficient method of manufacturing the organic EL device.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An organic EL device comprising:
   a pair of electrodes consisting of a positive electrode and a negative electrode;
   a plurality of banks which is disposed between the pair of electrodes and insulates the positive electrode and the negative electrode; and
   an organic EL light-emitting material in a plurality of gaps formed by bank partitions,
   wherein if the distance between the bank partitions in the gap at one electrode side is d, the distance between the bank partitions except at the one electrode side is d' and the distance between the bank partitions at the other electrode side to the one electrode side is d", then at least one of the gaps satisfies d>d", and the distance between the bank partitions in the gap progressively satisfies d−d'≧0 from the one electrode side to the other electrode.

2. An organic EL device according to claim 1, wherein at least one gap is formed by bank partitions having n steps, and if the distances between the bank partitions at the bases of the n steps are d1, d2, ..., dn−1, dn from the one electrode side to the other electrode side, d1>d2> ... >dn−1>dn.

3. An organic EL device according to claim 1, wherein the relation d1>d2> ... >dn−1>dn is satisfied by 90% or more of all the gaps.

4. An organic EL device according to claim 1, wherein at least one gap is formed by bank partitions having two or more steps, and the bank partitions which are situated closest to the one electrode side and form steps having the greatest distance between bank partitions, have a tapered shape.

5. An organic EL device according to claim 4, wherein all the steps formed by the bank partitions are tapered.

6. An organic EL device according to claim 1, wherein at least one gap is formed by bank partitions having a two-step tapered shape.

7. An organic EL device according to claim 6, wherein the taper angle of the step base near to the one electrode is smaller than the taper angle of the step base near to the other electrode.

8. An organic EL device according to claim 1, wherein the one electrode side is the positive electrode side, and the other electrode side is the negative electrode side.

9. An organic EL device according to claim 1, wherein the banks comprise an insulating material capable of being patterned.

10. An organic EL device according to claim 9, wherein the insulating material capable of being patterned is selected from among a photoresist and a heat-resistant polymer.

11. An organic EL device according to claim 9, wherein the insulating material capable of being patterned is a polyimide.

12. An organic EL device according to claim 9, wherein the insulating material capable of being patterned is selected from among inorganic materials.

13. An organic EL device according to claim 12, wherein the inorganic material is selected from among silicon nitride and silicon oxide.

14. An organic EL device according to claim 1, wherein the bank is a laminated structure of silicon nitride and silicon oxide.

15. An organic EL device according to claim 1, wherein the organic EL light-emitting material is selected from among polymer materials.

16. An organic EL device according to claim 1, wherein the organic EL light-emitting material in the gaps constitute pixels.

17. An organic EL device according to claim 16, wherein the organic EL light-emitting material in the gaps is selected from among a red light-emitting material, a green light-emitting material and a blue light-emitting material.

18. A method of manufacturing an organic EL device, wherein banks are formed by patterning from materials selected from among a photoresist and a heat-resistant polymer, and then plasma treatment is performed,
wherein the organic EL device comprises:
a pair of electrodes consisting of a positive electrode and a negative electrode;
a plurality of banks which is disposed between the pair of electrodes and insulates the positive electrode and the negative electrode; and
an organic EL light-emitting material in a plurality of gaps formed by bank partitions,
wherein if the distance between the bank partitions in the gap at one electrode side is d, the distance between the bank partitions except at one electrode side is d' and the distance between the bank partitions at the other electrode side to the one electrode side is d", then at least one of the gaps satisfies d>d", and the distance between the bank partitions in the gap progressively satisfies d−d'≧0 from the one electrode side to the other electrode side.

19. A method of manufacturing an organic EL device according to claim 18, wherein the banks are formed by coating the material selected from among a photoresist and a heat-resistant polymer on the positive electrode to form a film and by patterning the film by photolithography, the organic EL material is supplied to the gaps formed by these banks by the inkjet method, and then the negative electrode is formed.

20. A method of manufacturing an organic EL device according to claim 18, wherein plasma treatment is performed using a plasma gas selected from among an oxygen plasma and a fluorine plasma.

21. A method of manufacturing an organic EL device wherein banks are formed by patterning from a material selected from among inorganic materials, and then etching treatment is performed,
wherein the organic EL device comprises:
a pair of electrodes consisting of a positive electrode and a negative electrode;
a plurality of banks which is disposed between the pair of electrodes and insulates the positive electrode and the negative electrode; and
an organic EL light-emitting material in a plurality of gaps formed by bank partitions,
wherein if the distance between the bank partitions in the gap at one electrode side is d, the distance between the bank partitions except at the one electrode side is d' and the distance between the bank partitions at the other electrode side to the one electrode side is d", then at least one of the gaps satisfies d>d", and the distance between the bank partitions in the gap progressively satisfies d−d"≧0 from the one electrode side to the other electrode side.

22. A method of manufacturing an organic EL device according to claim 21, wherein the banks are formed by vapor-deposition of the inorganic material on the positive electrode by CVD method to form a vapor deposition film and by patterning the film by photolithography, the organic EL material is supplied to the gaps formed by these banks by the inkjet method, and then the negative electrode is formed.

23. A method of manufacturing an organic EL device according to claim 21, wherein the etching is performed using two or more types of etching gas.

24. A method of manufacturing an organic EL device according to claim 21, wherein the etching is performed using $CF_4/O_2$ gas and $CF_4$ gas.

25. A method of manufacturing an organic EL device according to claim 24, wherein the change-over from $CF_4/O_2$ gas to $CF_4$ gas is performed by monitoring plasma $N_2$, and the change-over from $CF_4$ gas to $CF_4/O_2$ gas is performed by monitoring plasma $F_2$.

26. A method of manufacturing an organic EL device according to claim 25, wherein the etching gas is changed over when the intensity of the plasma $F_2$ or plasma $N_2$ being monitored is 15% to 25%.

27. A method of manufacturing an organic EL device according to claim 21, wherein the banks are formed by patterning from two types of inorganic materials, and the upper layer etching rate is larger than the lower layer etching rate.

* * * * *